(12) United States Patent
Tseng

(10) Patent No.: US 6,412,104 B1
(45) Date of Patent: Jun. 25, 2002

(54) INTEGRATED CIRCUIT DEBUGGING SYSTEM

(75) Inventor: Fouriers Tseng, Hsin-Chu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 09/240,849

(22) Filed: Feb. 1, 1999

(51) Int. Cl.⁷ .............................................. G06F 9/445
(52) U.S. Cl. .......................................... 717/4; 714/738
(58) Field of Search .............................. 717/4; 714/724, 714/34

(56) References Cited

U.S. PATENT DOCUMENTS

| | | | | |
|---|---|---|---|---|
| 5,515,530 A | * | 5/1996 | Eskandari .................... | 395/180 |
| 5,568,067 A | * | 10/1996 | McDermott et al. .......... | 326/55 |
| 5,592,107 A | * | 1/1997 | McDermott et al. .......... | 326/49 |
| 5,757,819 A | * | 5/1998 | Segars ...................... | 371/22.32 |
| 5,771,240 A | * | 6/1998 | Tobin et al. ................ | 371/22.1 |
| 5,777,489 A | * | 7/1998 | Barbier et al. ................ | 326/40 |
| 5,923,899 A | * | 7/1999 | Martin et al. ................ | 395/828 |
| 5,991,888 A | * | 11/1999 | Faulkner et al. ............ | 713/501 |
| 6,014,752 A | * | 1/2000 | Hao et al. .................... | 713/500 |
| 6,057,706 A | * | 5/2000 | Barbier et al. ................ | 326/39 |

* cited by examiner

*Primary Examiner*—Mark R. Powell
*Assistant Examiner*—Michael B. Holmes

(57) ABSTRACT

An integrated circuit debugging system is provided for debugging the integrated circuits with bi-directional terminals is disclosed. The system includes clock unit for providing clocks, and address generating unit for generating address responsive to the provided clock. An I/O control memory is used to store pin status of an integrated circuit under test corresponding to each of the generated address; and a timing diagram memory is used to store fitting value of the integrated circuit. Moreover, the system includes an I/O manipulating unit for directing signal into and out of the integrated circuit according to the stored pin status of the I/O control memory, and for comparing the signal out of the integrated circuit under test and the fitting value from the timing diagram memory. Further, feedback control unit is configured to control the address generation of the address generating unit.

17 Claims, 4 Drawing Sheets

INTEGRATED CIRCUIT DEBUGGING SYSTEM

BACKGROUND OF THE INVENTION

1. Field of the Invention

The present invention relates to an integrated circuit debugging system, and more particularly, to a system for debugging an integrated circuit with bi-directional terminals.

2. Description of the Prior Art

Integrated circuit (IC) debugger or debugging system is commonly used to examine the operation and function of the integrated circuits. FIG. 1 shows a system block diagram illustrating one of conventional IC debuggers. A test pattern is firstly provided from a memory 12 to a comparator 14. Subsequently, the provided test pattern is compared with the output from an integrated circuit (IC) under test 16, and a defective IC is therefore isolated. Unfortunately, due to the uni-directional data flow configuration, this conventional IC debugger 10 can not be adapted to debugging an integrated circuit with bi-directional terminals.

For the foregoing reason, there is a need for an integrated circuit debugging system for checking and debugging the integrated circuits with bi-directional terminals.

SUMMARY OF THE INVENTION

In accordance with the present invention, an integrated circuit debugging system is provided for debugging the integrated circuits with bi-directional terminals. In one embodiment, the system includes a clock unit for providing a clock, and a counter counting responsive to the provided clock for generating address. The system also includes an I/O control memory for storing pin status of an integrated circuit under test corresponding to each of the generated address, and a timing diagram memory for storing fitting value of the integrated circuit corresponding to each of the generated address. A tri-state gate is configured to receive the fitting value from the timing diagram memory, and then a comparator is configured to receive and compare the fitting value of the timing diagram memory and signal from the integrated circuit, wherein the integrated circuit is connected to receive output of the tri-state gate when the tri-state gate is enabled. Further, feedback controller is used to control the address generation of the counter, wherein the feedback controller directs one signal or a number of signals indicative of the compared signal from a terminal or a number of terminals, respectively, of the integrated circuit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
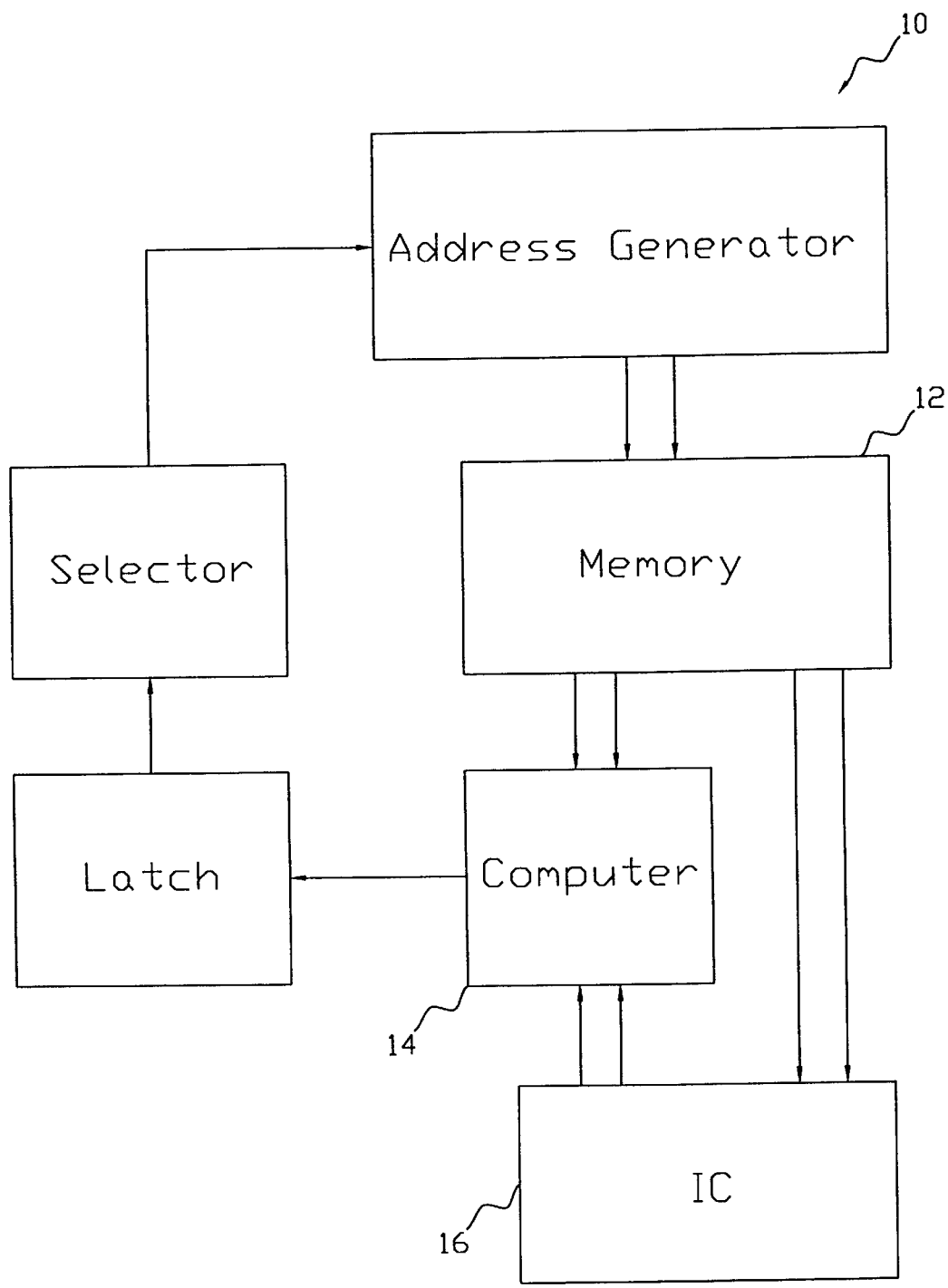
FIG. 1 shows a system block diagram illustrating one of conventional IC debuggers.
Figure 2:
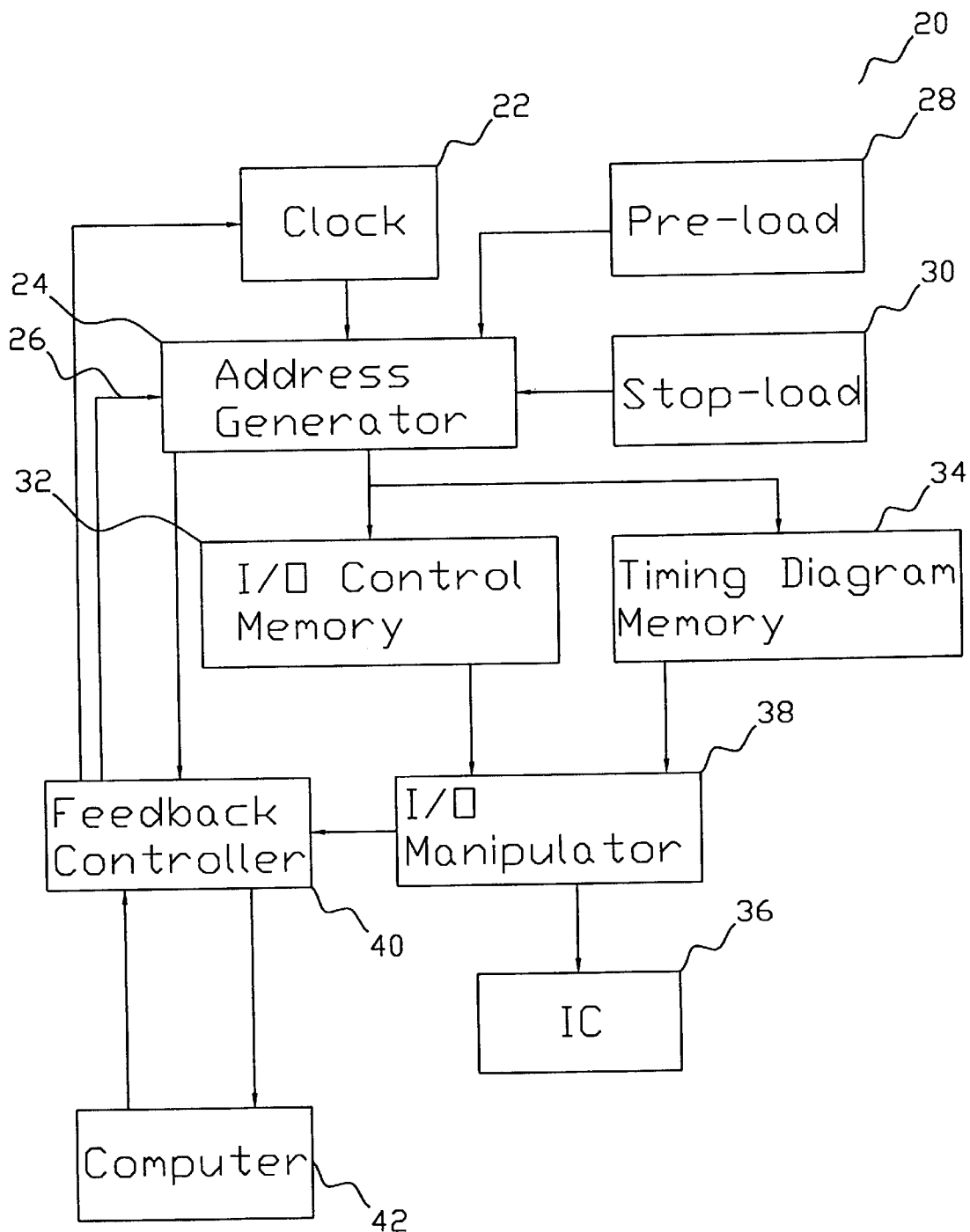
FIG. 2 shows a system block diagram of an integrated circuit debugging system according to one embodiment of the present invention.

FIG. 2 shows a system block diagram of an integrated circuit debugging system 20 according to one embodiment of the present invention. The integrated circuit debugging system 20 includes a clock unit 22, which provides clock pulses for the system 20. An address generator 24 is used to generate appropriate address in response to the clock from the clock unit 22. The address generator 24 is preferably implemented by a conventional counter. In this embodiment, the address generator 24 is primarily made of a counter with a multi-bit output. Further, this counter 24 is controlled by a control input 26, so that the content of the counter 24 can be either cleared, preloaded according to a pre-load setting 28, or stop-loaded according to a stop-load setting 30.

The generated address from the address generator 24 is subsequently fed to an I/O control memory 32 and a timing diagram memory 34, respectively. The I/O control memory 32 stores pin status of an integrated circuit 36 under test corresponding to each of the generated address. Particularly, the stored pin status in the I/O control memory 32 indicates whether the specific bi-directional terminal of the integrated circuit 36 is used as an input terminal or as an output terminal at each specific address. The timing diagram memory 34 stores fitting value (or data) of the integrated circuit 36 corresponding to each of the generated address. Particularly, the stored fitting value in the timing diagram memory 34 is the predetermined input or output value of the specific terminal of the integrated circuit 36, wherein the predetermined input or output value is then compared to a real input or output signal of the integrated circuit 36. The aforementioned I/O control memory 32 or the timing diagram memory 34 is implemented by a conventional semiconductor memory, such as a dynamic random access memory (DRAM), a static random access memory (SRAM), or an erasable read only memory (ROM).

Figure 3:
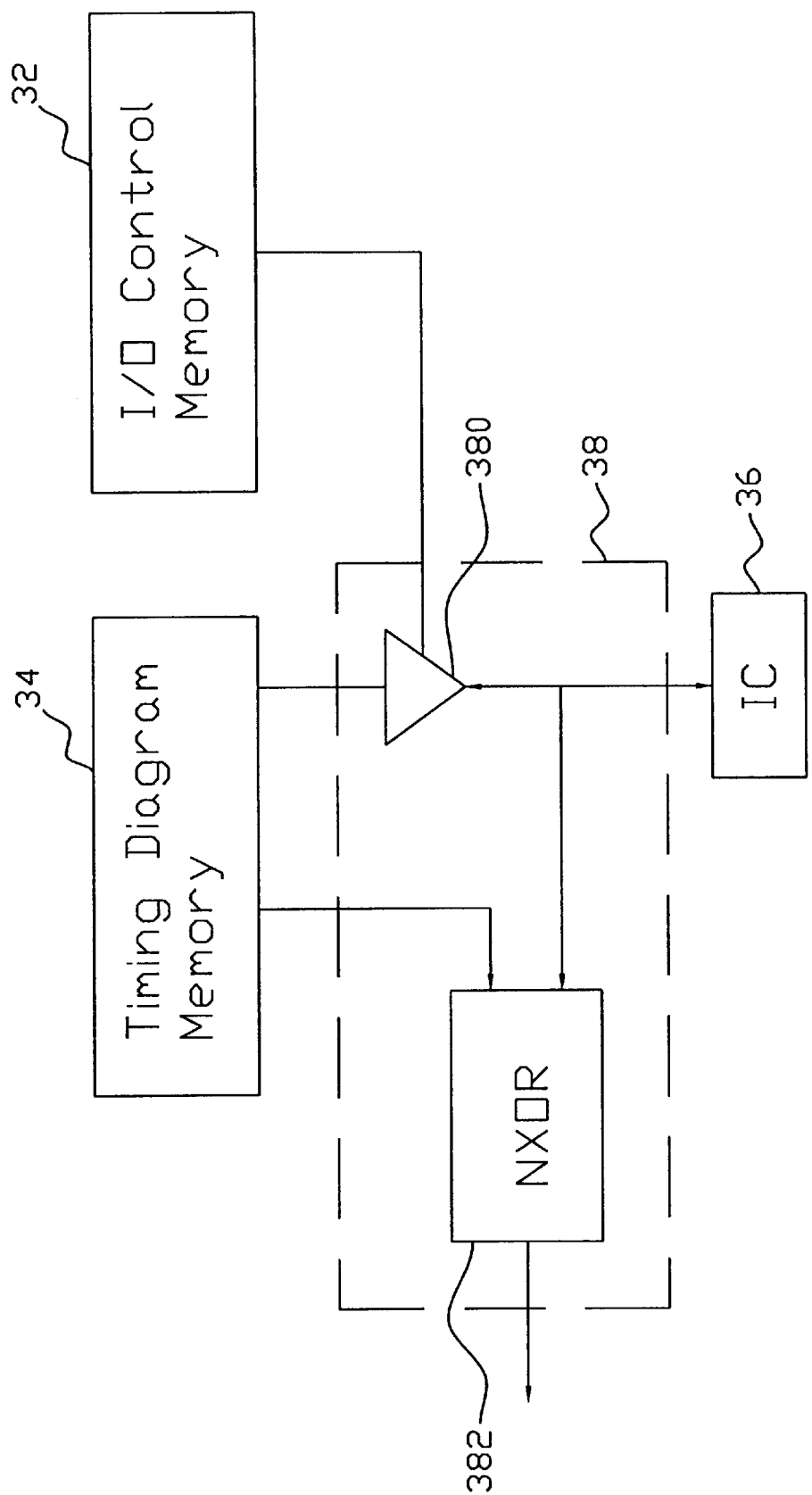
FIG. 3 shows a schematic diagram illustrating one embodying circuit of the I/O manipulator of the present invention.

In the debugging system 20, an I/O manipulator 38 is used to direct the signal into and out of the integrated circuit 36 according to the stored pin status of the I/O control memory 32, and is further used to compare the real signal out of the integrated circuit 36 and the predetermined fitting value of the timing diagram memory 34. FIG. 3 shows a schematic diagram illustrating one embodying circuit of the I/O manipulator 38. In the I/O manipulator 38, a tri-state gate (or buffer) 380 is configured to receive the predetermined fitting value from the timing diagram memory 34, and the tri-state gate 380 is controlled by the I/O control memory 32. Specifically, at a specific time when the terminal of the integrated circuit 36 under test is used as an input terminal, the tri-state gate 380 is then enabled by the output from the I/O control memory 32, and the predetermined fitting value (or a test pattern) is therefore directed to the integrated circuit 36 via the tri-state gate 380. On the other hand, at another time when the terminal of the integrated circuit 36 is used as an output terminal, the tri-state gate 380 is then disabled (or made high-impedance) by the output of the I/O control memory 32, and the output signal from the integrated circuit 36 is therefore directed to a comparator 382, such as a not-exclusive-OR (NXOR) gate. The NXOR gate 382 receives and compares the output of the integrated circuit 36 and the predetermined fitting value of the timing diagram memory 34. The following Table 1 shows a truth table of the NXOR gate 382.

TABLE 1

| NXOR | | |
|---|---|---|
| 0 | 0 | 1 |
| 0 | 1 | 0 |
| 1 | 0 | 0 |
| 1 | 1 | 1 |

According to the values in the table, the I/O manipulator 38 generates a logic-high signal whenever the predetermined fitting value of the timing diagram memory 34 and the signal of the terminal of the integrated circuit 36 are the same, and generates a logic-low signal otherwise.

Figure 4:
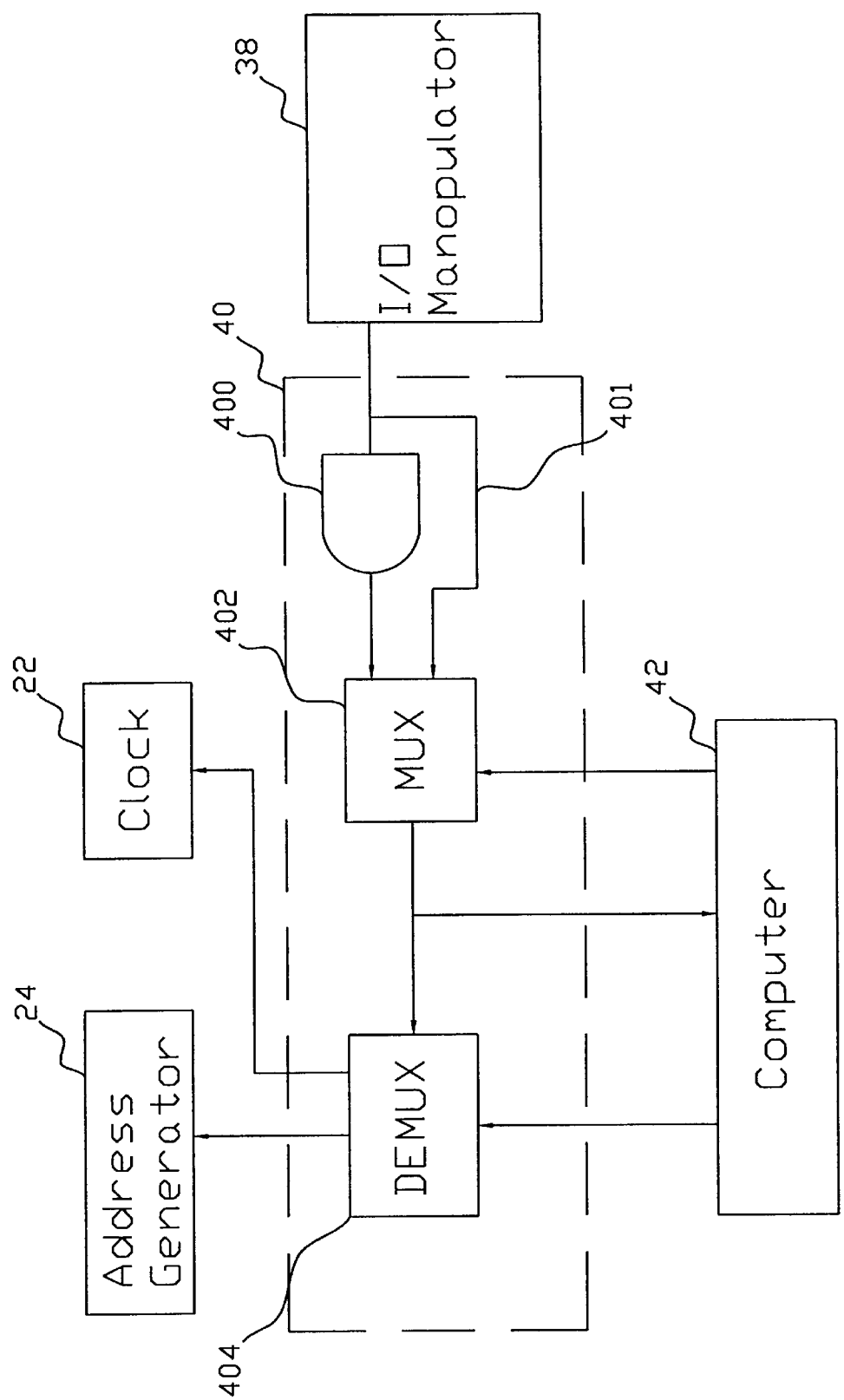
FIG. 4 shows a schematic diagram illustrating one embodying circuit of the feedback controller of the present invention.

The debugging system 20 further includes a feedback controller 40 for controlling the address generation of the address generator 24. Specifically, the address generator 24 can be cleared under control of the feedback controller 40, can be preloaded from a default value, such as pre-load setting 28 or stop-load setting 30, or can be preloaded from a computer 42. The feedback controller 40 further directs one signal or a number of signals indicative of the compared output from the I/O manipulator 38. FIG. 4 shows a schematic diagram illustrating one embodying circuit of the feedback controller 40. In the feedback controller 40, one-pin or all-pin checking (or comparison) is determined by a multi-input AND gate 400 and a turn-around routing 401, one of which is then selected by a multiplexer 402, which is controlled under the computer 42. A demultiplexer 404, which is also controlled under the computer 42, is used to receive output of the multiplexer 402. One of the multiple outputs of the demultiplexer 404 is connected respectively to the address generator 24 or the clock unit 22. Using the configuration of the feedback controller 40, the address generator 24 accordingly either generates the next address, holds at current address, clears and restarts generating address, or pre-loads previous address.

According to the configuration of the integrated circuit debugging system of the present invention, an integrated circuit with bi-directional terminal can thus be checked and debugged. Moreover, the checking can be done with respect to either one pine or a number of pins of the integrated circuit under test.

Although specific embodiments have been illustrated and described, it will be obvious to those skilled in the art that various modifications may be made without departing from what is intended to be limited solely by the appended claims.

What is claimed is:

1. An integrated circuit debugging system, comprising:
   means for providing a clock;
   means for generating address responsive to the provided clock;
   an I/O control memory storing pin status of an integrated circuit under test corresponding to each of the generated address;
   a timing diagram memory storing fitting value of the integrated circuit corresponding to each of the generated address;
   I/O manipulating means for directing signal into and out of the integrated circuit according to the stored pin status of said I/O control memory, and for comparing the signal out of the integrated circuit under test and the fitting value from said timing diagram memory; and
   feedback control means for controlling the address generation of said address generating means.

2. The system according to claim 1, wherein said address generating means comprises a counter.

3. The system according to claim 2, wherein content of said counter is cleared under control of said feedback control means.

4. The system according to claim 3, wherein said counter is preloaded under control of said feedback control means.

5. The system according to claim 1, wherein I/O manipulating means comprises:
   a tri-state gate configured to receive the fitting value from said timing diagram memory under control of said I/O control memory; and
   a comparator configured to receive and compare the fitting value of said timing diagram memory and signal from the integrated circuit, wherein the integrated circuit is connected to receive output of said tri-state gate when the tri-state gate is enabled.

6. The system according to claim 5, wherein said comparator comprises a not-exclusive OR (NXOR) gate.

7. The system according to claim 1, wherein said feedback control means directs one signal or a plurality of signals indicative of the compared signal from a terminal or a plurality of terminals, respectively, of the integrated circuit.

8. The system according to claim 7, wherein said one signal or said plurality of signals are directed by a multiplexer.

9. The system according to claim 8, wherein said feedback control means comprises a demultiplexer configured to receive output of said multiplexer, output of said demultiplexer being respectively connected to said address generating means and said clock providing means.

10. The system according to claim 9, further comprising a computer configured to respectively control said multiplexer and said demultiplexer.

11. An integrated circuit debugging system, comprising:
    a clock unit for providing a clock;
    a counter counting responsive to the provided clock for generating address;
    an I/O control memory storing pin status of an integrated circuit under test corresponding to each of the generated address;
    a timing diagram memory storing fitting value of the integrated circuit corresponding to each of the generated address;
    a tri-state gate configured to receive the fitting value from said timing diagram memory;
    a comparator configured to receive and compare the fitting value of said timing diagram memory and signal from the integrated circuit, wherein the integrated circuit is connected to receive output of said tri-state gate when the tri-state gate is enabled; and
    feedback controller for controlling the address generation of said counter, wherein said feedback controller directs one signal or a plurality of signals indicative of the compared signal from a terminal or a plurality of terminals, respectively, of the integrated circuit.

12. The system according to claim 11, wherein content of said counter is cleared under control of said feedback controller.

13. The system according to claim 12, wherein said counter is preloaded under control of said feedback controller.

14. The system according to claim 11, wherein said comparator comprises a not-exclusive OR (NXOR) gate.

15. The system according to claim 11, wherein said one signal or said plurality of signals are directed by a multiplexer.

16. The system according to claim 15, wherein said feedback controller comprises a demultiplexer configured to receive output of said multiplexer, output of said demultiplexer being respectively connected to said counter and said clock unit.

17. The system according to claim 16, further comprising a computer configured to respectively control said multiplexer and said demultiplexer.

* * * * *